United States Patent [19]

Butler et al.

[11] 4,438,509
[45] Mar. 20, 1984

[54] TRANSDUCER WITH TENSIONED-WIRE PRECOMPRESSION

[75] Inventors: John L. Butler, Marshfield; Thomas R. Egan, South Dartmouth, both of Mass.; Kenneth Rodberg, East Providence, R.I.; Arthur E. Clark, Adelphi, Md.

[73] Assignee: Raytheon Company, Lexington, Mass.

[21] Appl. No.: 264,518

[22] Filed: May 18, 1981

[51] Int. Cl.³ ..................... H04B 17/00; H04R 17/00
[52] U.S. Cl. .................................. 367/156; 367/165; 367/168; 310/26
[58] Field of Search ................. 367/89, 156, 158, 159, 367/165, 168, 170; 310/26

[56] References Cited

U.S. PATENT DOCUMENTS

| | | | |
|---|---|---|---|
| 1,525,823 | 2/1925 | Nicolson | 67/165 |
| 3,778,758 | 12/1973 | Carson | 367/158 |
| 3,930,912 | 3/1960 | Miller | 367/157 |
| 4,223,428 | 9/1980 | Holloway | 367/165 |
| 4,326,275 | 4/1982 | Butler | 367/160 |

FOREIGN PATENT DOCUMENTS 394994 7/1933 United Kingdom ............... 367/156

Primary Examiner—Nelson Moskowitz
Attorney, Agent, or Firm—Martin M. Santa; Richard M. Sharkansky; Joseph D. Pannone

[57] ABSTRACT

A rod of magnetostrictive material has its ends placed between steel bars which provide compression on the rod by tensioning wires connected between the bars. Preferably, the wires are equally spaced along the bars from the rod so that when the wires are equally tensioned the rod is under no bending stress. The tension of the wires (and from this value, the compression of the rod) is conveniently determined by the freqency of vibration of the wires using known physical relationships between these quantities.

8 Claims, 2 Drawing Figures

TRANSDUCER WITH TENSIONED-WIRE PRECOMPRESSION

This invention was made in the course of the performance of work under a contract from the U.S. Navy, Contract No. N 66001-77-C-0095.

BACKGROUND OF THE INVENTION

Most transducer materials which are suitable for use at frequencies suitable for underwater sound transmission are weaker in tension than they are in compression. Typically, these materials can withstand and operate at compression values of over 10,000 psi but will fracture with only 2,000 psi tension. This is true of piezoelectric ceramic materials and magnetostrictive rare earth irons such as Terfenol D ($Tb_{0.3}Dy_{0.7}Fe_2$). In prior art transducer designs, the need for precompressing the transducer material is satisfied by the use of a high strength steel bolt, or fiberglass wrapping under tension, or both. Typical precompression values of 4,000 to 5,000 psi allows operation with an alternating stress field of approximately 4,000 psi maximum. The precompression also strengthens the transducer material against mechanical shock and vibration.

In some applications requiring precompression of transducer materials, the stress bolts are too cumbersome and too rigid to be used effectively and can lead to a severe reduction in the effective coupling coefficient of the transducer. The use of the fiberglass wrapping technique for precompression is also not feasible in some configurations of transducer materials.

SUMMARY OF THE INVENTION

It is therefore an object of this invention to provide an improved means for providing precompression of the transducer material which may be used where the prior art techniques are not feasible. It is a feature of this invention that the compressive stress can be applied to the transducer material in a balanced manner in order to eliminate bending torque on the magnetostrictive material caused by the precompression. It is a further feature of the invention that the elongation per unit length of the compressive stress producing material is large. Therefore, the displacement produced by the transducer material per unit of electrical drive energy is not reduced as by the prior art precompression techniques; thereby, the efficiency of the transducer is increased by reducing the drive power and the heat dissipation for the same power output.

In a preferred embodiment of the invention, the preceding objects and features are obtained by precompressing the transducer material with tensioned wires. The magnetostrictive material, typically in the form of a rod of Terfenol D which is relatively long with respect to its diameter, has parallel plane ends transverse to its longitudinal axis. Each end of the rod of magnetostrictive material is placed in contact with a steel bar. Tensioned steel wires attached to the bars on each side of the transducer material produce precompression on the material. The ends of the transducer material are placed on the steel bar midway between the points of attachment of the steel wires. The tension on each steel wire, if equal, will result in an axially directed compressive force on the transducer material with no bending moment on the transducer rod to cause the brittle rod to break. A transducer drive assembly or module, assembled as above, is suitable for use as a driving element of a transducer. A transducer, wherein transducer drive modules are arranged to approximate chords of a circle to produce a radial motion of pistons to which they are attached, is shown as an example of the utilization of a plurality of transducer drive modules constructed according to the invention. The term transducer includes either electromechanical or electroacoustic devices.

BRIEF DESCRIPTION OF THE DRAWINGS

The aforementioned objects and features of the invention are explained in the following description taken in conjunction with the accompanying drawings.

DESCRIPTION OF THE PREFERRED EMBODIMENT

Figure 1:
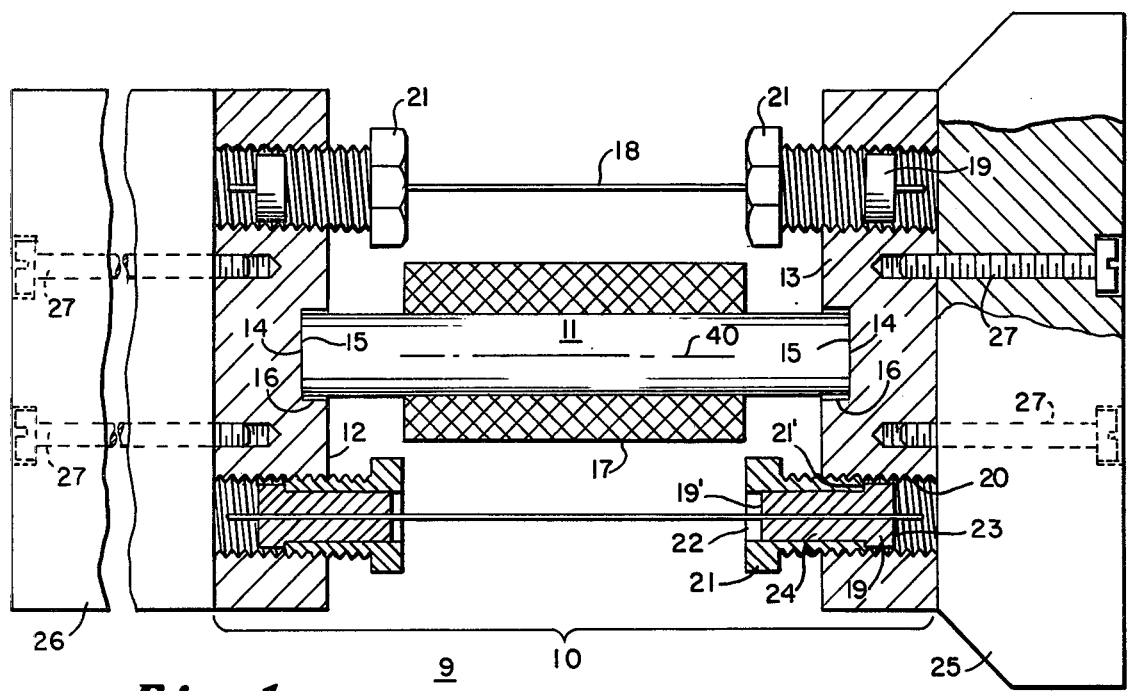
FIG. 1 is a partial cross-sectional view of a transducer made in accordance with the invention.

Referring now to FIG. 1, there is shown in partial cross-section a transducer drive element 10 which comprises a magnetostrictive rod 11, typically a composition of terbium, dysprosium and iron, $Tb_{0.3}Dy_{0.7}Fe_2$, attached to end pieces 12,13 typically of metal such as steel. The ends 15 of the rod 11 are set into a cement 14 in recesses 16 of the bars 12,13 primarily for convenience of assembly. Although the invention is especially desirable for use with a brittle rod 11 of a magnetostrictive rare earth and its associated energizing coil 17, it should be understood that the invention applies to other physical configurations and compositions of magnetostrictive or piezoelectric materials.

Two high strength wires 18, which are preferably equally spaced from the rod 11, are attached to ferrules 19 by bonding wire 18 in a closely fitting hole 19' in ferrule 19. An adhesive which was found to be suitable is the commercially available anaerobic adhesive, typical of such is Loctite #35, available from the Loctite Co. of Newington, Conn. Although this adhesive has been found satisfactory, the wire 18 may be retained in the ferrule 19 by alternate means such as by brazing or welding. The strength and permanance of the attachment must be sufficient to withstand the tension to which the wire 18 is to be subjected. The ferrule 19 has a maximum diameter less than the minimum diameter of the threads 20 in the end members 12,13 which allows the ferrule 19 to move longitudinally along the axis of the threads 20. Before attaching the ferrules to the wire 18, screws 21, each having an axial cylindrical hole 22, are slid onto the wire 18. Screwing the screws 21 into the end members 12, 13 causes the screw end 21' to press against the larger diameter portion 23 of the ferrule 19 to thereby tension the wire 18. Tensioning the wires 18 will cause the end members 12, 13 to be pulled toward one another, which motion is opposed by the magnetostrictive rod 11 thereby imposing a compressive force on the rod 11. The ferrule 19 is preferably constructed with an aligning portion 24 which is a close slidable fit within the hole 22 of screw 21. This slidable fit will maintain the ferrule 19 centrally located within the threads 20 to avoid binding of the ferrule 19 in the threads 20 when pressure is applied upon the ferrule by the screw 21.

The wires 18 are high strength wires which preferably will withstand stress up to 200,000 psi such as Inconel X-750. When the wires 18 are equally spaced from the magnetostrictive rod 11, equal tension on the wires 18 will cause a balanced compression upon the rod 11 and thus avoid a bending moment which would tend to destroy the brittle Terfonel D magnetostrictive rod 11. Equal tension on the wires is easily obtained by adjusting the resonant frequency of the wires by tuning screw 21. The fundamental resonant frequency f for a wire of length L may be written as $$f = \frac{1}{2L}\sqrt{\frac{T}{\rho}},$$

where T is the tension and $\rho$ is the density. Thus, the wires 18 are stretched until they resonate at the frequency corresponding to the desired tension. In order that the frequency of resonance at the desired tension be the same on the two wires 18, the length L (the distance separating the ferrules) is equal for both the wires 18 before they are placed under tension. The resonant frequency of the wire may be determined by exciting each wire 18 by simply driving the transducer coil 17 with a variable frequency oscillator (not shown). The resonance can be detected by visual observation of the frequency providing the largest motion of small folded piece of paper on the center of the wire.

In a particular example of the apparatus of this invention, a rare earth Terfenol D rod was subjected to a compressive stress of 2,000 psi. The rod was approximately 2 inches long with a diameter of 0.23 inches. The two Inconel X-750 stress wires 18 were of equal length (two inches between the ferrules 19). The diameter of Inconel X-750 stress wires 18 was only 0.035 inches. This small diameter was sufficiently large to limit the required stress in each wire to 50,000 psi in order to provide the desired 2,000 psi stress in the 0.23 inch diameter rod. When the stress on the wires was 50,000 psi, the wires 18 at their chosen length resonated at 2 kilohertz. The small diameter of wire 18 was chosen to have a large strain in wire 18 in order to have the minimum effect on the electroacoustic performance of the transducer.

The transducer drive module 10 of FIG. 1 is shown attached by screws 27 to a vibratile plate member 25 and an inertia mass member 26 to provide a transducer 9 of simple configuration well known to those skilled in the art. The physical size of the members 25, 26 is generally significantly larger than that of the drive module 10. As is also known to those skilled in the underwater transducer art, the structure of FIG. 1 is usually flexibly mounted in a housing which is waterproof but capable of transmitting the vibrations of the vibratile member 25 into the water medium surrounding the transducer 9. FIG. 1 merely represents schematically one possible configuration in which the drive module 10 may be embodied.

Figure 2:
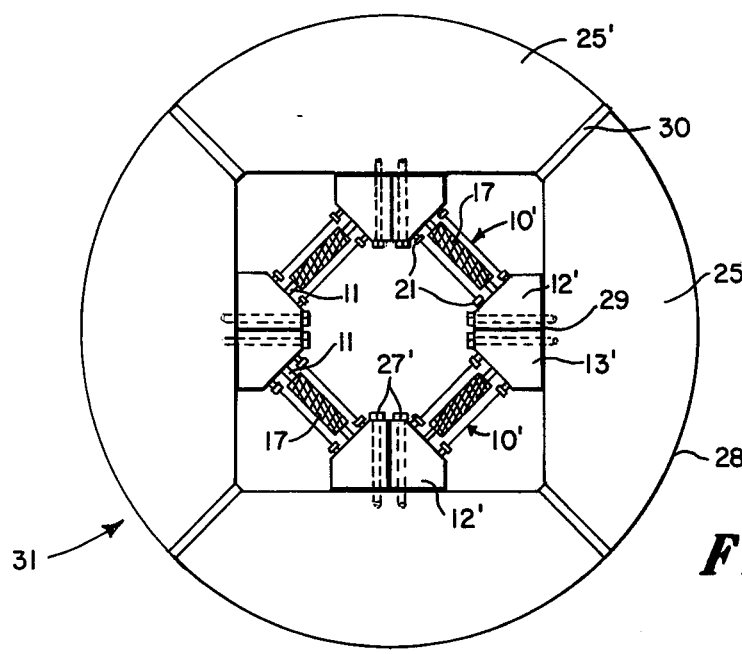
FIG. 2 is an end view of another type of transducer made in accordance with the invention.

The transducer drive module 10, described above, is shown assembled with other transducer modules 10 to provide a different form of transducer 31 as shown in end view FIG. 2. In the transducer of FIG. 2 there is no need for an inertia mass 26 since each transducer module 10 is arranged with both its ends connected to vibratile elements 25' which move in response to a change in length of rod 11. The modules 10' are electrically energized to cause their respective magnetostrictive elements 11 to change equally in length and in phase thereby causing the circle formed by the outer surface 28 of the vibratile elements 25' to change in conformity with the excitation of the drive coils 17. The end members 12', 13' of the module 10 are attached to the vibratile members 25' by screws 27'. A cement 29 is preferably used between the end pieces 13' and between the vibratile plate 25'. The space 30 between the vibratile members 25' is filled with a polyurethane. The transducer 31 is fitted with two watertight end caps (not shown) to the outer surface 28 of the vibratile members 25' and the assembly is potted in polyurethane to provide a watertight structure.

It should be noted that the axis 40 of the magnetostrictive rod 11 and the wires 18 preferably lie in a plane otherwise a bending torque is produced on the rod. Also, it is apparent that more than two wires, preferably uniformly spaced around and from the rod, could be used if desired.

It is understood that the above described embodiments of the invention are illustrative only and that modifications thereof may occur to those skilled in the art. Accordingly, it is desired that this invention is not to be limited to the embodiments disclosed herein but it is to be limited only as defined by the appended claims.

What is claimed is:

1. Apparatus for providing compressive stress to a transducer magnetostrictive rod comprising:
   a pair of bars;
   said rod having its ends in contact with said pair of bars;
   means for providing an electrical signal to said magnetostrictive rod;
   a pair of wires attached to and between said bars, each wire being attached to said bars on opposite sides of said rod;
   means for providing tension in each of said wires;
   said bars providing a compressive force on said rod in response to the tension in said wires; and
   means for measuring said tension in each of said wires from the resonant frequency of each wire in response to the frequency of said electrical signal.

2. The apparatus of claim 1 wherein said means for providing tension comprises:
   ferrule means attached to at least one end of each of said wires;
   screw means threadedly engaged to at least one of said bars and in slidable contact with said ferrule means to move said ferrule means in a direction to change the tension of said wire in response to the extent of said threaded engagement.

3. The apparatus of claim 2 wherein:
   said attached means comprises a ferrule bonded to said wire, said ferrule having a first portion of one diameter and a second portion of a smaller diameter;
   said screw means having a hole along its axis having a diameter sufficiently large to allow said ferrule second portion to be inserted, said ferrule first portion being in slidable contact with an end of said screw means.

4. The apparatus of claim 1 wherein the axis of said rod is in the plane containing said wires.

5. A transducer mechanism comprising:
   a transducer material;
   means for electrically energizing said material;
   means for applying compressive force to said material;
   said compressive force providing means comprising at least one wire means;
   said wire means comprising means for applying a tensioning force to said wire to cause said force providing means to apply said compressive force to said material; and means for determining the resonant frequency of said wire in response to the frequency of said electrically energizing means.

6. The apparatus of claim 5 wherein said means for applying a tensioning force to said wire means comprises:

means for attaching an end of said wire to said compressive force providing means;

screw means attached between the other end of said wire and said compressive force providing means whereby tensioning of said screw increases the tension force of said wire and thus the compressive force upon said material.

7. The apparatus of claim 1 wherein said wires are equally spaced from said magnetostrictive rod and are of equal length and diameter.

8. A method for providing balanced axially directed forces for a magnetostrictive rod having at least two wires attached to means for providing axial compression on said rod comprising each said wire having a known diameter and length and distance from said rod;

means attached to each said wire for providing a tension in said wire;

said magnetostrictive rod having means for driving said rod by a variable frequency magnetic field;

the method of equally tensioning said wires comprising applying a magnetic field frequency to said driving means;

adjusting the tension in each wire until said wire resonates at the frequency of said applied magnetic field to thereby provide a predetermined amount of tension in each wire.

* * * * *